US006340918B2

(12) United States Patent
Taylor

(10) Patent No.: US 6,340,918 B2
(45) Date of Patent: Jan. 22, 2002

(54) NEGATIVE FEEDBACK AMPLIFIER CIRCUIT

(75) Inventor: Craig Taylor, Oldham (GB)

(73) Assignee: Zetex PLC (GB)

( * ) Notice: Subject to any disclaimer, the term of this patent is extended or adjusted under 35 U.S.C. 154(b) by 0 days.

(21) Appl. No.: 09/727,836

(22) Filed: Nov. 30, 2000

(30) Foreign Application Priority Data

Dec. 2, 1999 (GB) ............................................ 9928458

(51) Int. Cl.[7] ................................................ H03F 1/14
(52) U.S. Cl. ........................ 330/292; 330/300; 323/314
(58) Field of Search ................................ 330/292, 300; 323/314

(56) References Cited

U.S. PATENT DOCUMENTS

RE30,586 E * 4/1981 Brokaw ...................... 323/314
4,714,872 A * 12/1987 Traa ........................... 323/314
5,117,200 A * 5/1992 Scott, III .................... 330/253

FOREIGN PATENT DOCUMENTS

EP 0 766 164 A2 4/1997

* cited by examiner

*Primary Examiner*—Robert Pascal
*Assistant Examiner*—Henry Choe
(74) *Attorney, Agent, or Firm*—Skjerven Morrill MacPherson LLP; Norman R. Klivans

(57) ABSTRACT

An amplifier circuit comprises a first amplifier stage controlling a second gain stage which is coupled between a voltage input node and an output node. A frequency compensating circuit is coupled between a compensating circuit node of the gain stage and a control input of the gain stage. The gain stage comprises first and second output devices arranged such that for a given gate voltage, the output current from the first device is greater than the output current from the second device. The output devices have a common source coupled to the input node and a common gate coupled to the first amplifier stage. The drain of the first output device is coupled to the output node and the drain of the second output device is coupled to the compensating circuit node with a resistance device connected between the two drains.

22 Claims, 3 Drawing Sheets

NEGATIVE FEEDBACK AMPLIFIER CIRCUIT

BACKGROUND OF THE INVENTION

The present invention relates to frequency compensation of multi-stage amplifier circuits. Particularly, but not exclusively, the invention provides a frequency compensating scheme for negative feedback amplifier circuits such as voltage regulators, and in particular for low drop-out voltage regulators.

Multi-stage amplifier circuits (which may be integrated on a single chip) are used in many applications. One such common application is power supply voltage regulators which are universally used to convert an unregulated DC input voltage to a regulated DC output voltage using negative feedback to compare the output voltage with a stable reference voltage. A typical voltage regulator comprises a transistor output stage controlled by a differential amplifier (the error amplifier). The output of the error amplifier is coupled to the base/gate of the output transistor and thus controls the voltage at the base/gate. The output stage receives an unregulated DC input and delivers a regulated DC output voltage which is controlled by negative feedback to an input of the error amplifier, the other input of the amplifier being coupled to a stable voltage reference. In a regulator which produces an output voltage greater than the reference voltage, a voltage divider couples the output port to ground and the negative feedback signal is developed at a node located within the voltage divider so that a fraction of the output voltage is compared with the reference voltage and the output voltage is maintained at a predetermined multiple of the reference voltage.

The efficiency of a voltage regulator can be increased by minimizing the drop-out voltage (i.e. the voltage difference between the unregulated input voltage and the regulated output voltage). Conventionally this is achieved by operating the output pass transistor in common source/emitter mode using, for instance, a pnp transistor or, more commonly, a P-MOSFET (which will produce a positive polarity output). Such voltage regulators are referred to as low drop-out voltage regulators (LDO regulators).

A disadvantage of conventional LDO regulators is that they are highly sensitive to loading conditions (i.e. output current and capacitance) and must be frequency compensated in order to ensure the output voltage remains stable. Conventional frequency compensation schemes limit the load regulation performance and DC accuracy of the output.

Accordingly, it is a first object of the present invention to provide an amplifier circuit with improved frequency compensation.

A further problem associated with many conventional frequency compensation methods is the injection of ripple into the output voltage. It is desirable to reduce this as much as possible. This may be achieved by the addition of a large bypass capacitor to the output or by the use of cascode compensation. It is, however, a further object of the present invention to provide a scheme for improved supply ripple rejection in an amplifier circuit.

SUMMARY OF THE INVENTION

According to a first aspect of the present invention there is provided an amplifier circuit comprising a first amplifier stage controlling a second gain stage which is coupled between an input node and an output node, and a frequency compensating circuit coupled between a compensating circuit node of the second gain stage and a control input of the second gain stage, wherein the output stage comprises:

- first and second output devices arranged such that for a given gate voltage, the output current from the first device is greater than the output current from the second device;
- the output devices having a common source coupled to the input node and a common gate, which constitutes said control input, coupled to the first amplifier stage;
- the drain of the first output device being coupled to the output node and the drain of the second output device being coupled to the compensating circuit node; and
- a resistance device connected between the drains of the two output devices.

According to a second aspect of the present invention there is provided a frequency compensating circuit for an amplifier circuit which comprises an output device coupled between an input node and an output node and controlled by an amplifier stage, the source of the output device being coupled to the input node, the drain of the output device being coupled to the output node, and the gate of the output device being coupled to the amplifier, the frequency compensating circuit comprising:

- a second output device having its source coupled to the input node and its gate coupled to the output of the amplifier stage in common with the first output device; and
- a capacitor coupled between the drain of the second output device and the common gate of the first and second output devices;
- wherein the second output device is configured to produce a smaller current than the first output device for a given gate voltage, and the drains of the first and second output devices are separated by a resistance device.

It is to be understood that although the terms gate, source and drain have been used above (and in the appended claims), the invention is not limited to FET devices and could be implemented using other devices such as bipolar transistors and valves. Accordingly, the terms "gate", "source" and "drain" should be interpreted as covering the corresponding elements of other forms of output device such as, for instance, the base, emitter and collector of a transistor.

It will be appreciated that the resistance device may be any device which has resistance and need not be a conventional resistor. For instance, the resistance could be provided by a transistor. The value of the resistance may vary considerably with different applications of the invention and can be selected as appropriate for any given application. For example, in a typical voltage regulator an appropriate resistance may be in the range of 1 kΩ to 20 kΩ although for other amplifier circuits the appropriate resistance may be much higher or much lower than this range.

Reference is made to a compensating circuit coupled between a compensating node and a control input of the second gain stage. It is to be understood that the compensation circuit need not necessarily be coupled directly to either the compensating node or the control input and there may be other circuit elements which interconnect the compensating circuit with the compensating circuit node and/or second gain stage input.

Preferably the first and second output devices are arranged to provide a fixed ratio of output currents over the operational range of the amplifier circuit. The ratio of the two currents may vary significantly in different embodiments of the invention. The invention will operate at any ratio greater than 1:1 and the ratio could be many thousands to 1. In many practical applications the ratio will be of the order of at least 1000:1.

The present invention has many applications and in particular is suitable for frequency compensating LDO voltage regulators.

Other alternative and preferred features of the invention will be apparent from the following description and the appended claims.

BRIEF DESCRIPTION OF THE DRAWINGS

Specific embodiments of the present invention, will now be described and contrasted with the prior art, by way of example only, with reference to the accompanying drawings in which.

DESCRIPTION OF THE PREFERRED EMBODIMENT

Figure 1:
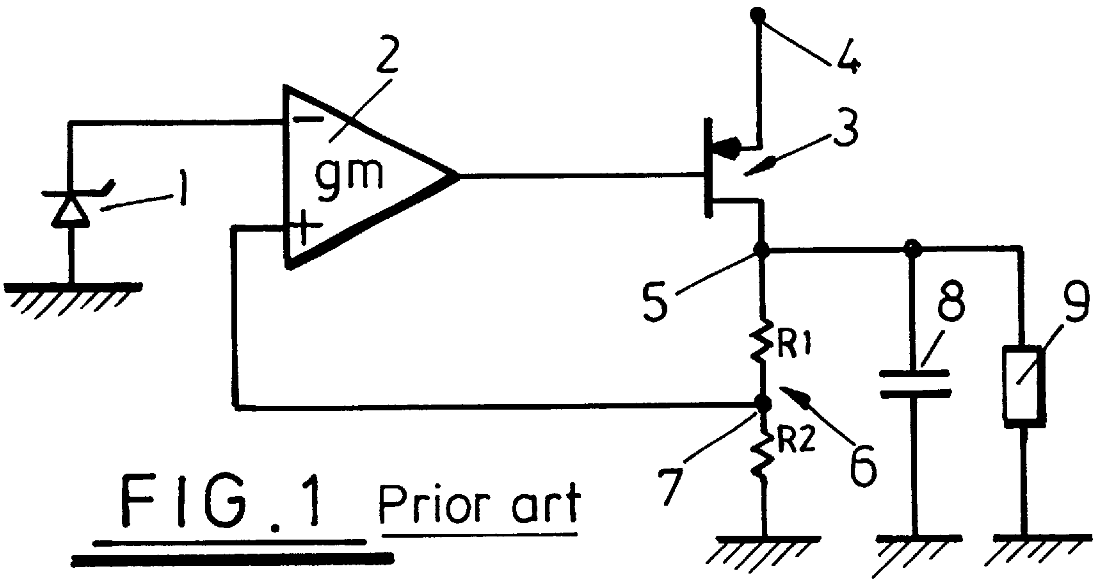
FIG. 1 Prior art
FIG. 1 illustrates the fundamental components of a conventional LDO regulator.

FIG. 1 illustrates the basic configuration of a conventional LDO regulator comprising a reference voltage 1, an error amplifier 2, an output pass transistor 3 (p-channel MOSFET), an unregulated DC input port 4, a regulated DC output port 5, a voltage divider 6 and a negative feedback node 7. The reference voltage (of which many conventional forms are known) is coupled to one input of the error amplifier 2. The output of the error amplifier 2 is coupled to the gate of the transistor 3 and controls the gate voltage. The source of the transistor 3 is coupled to the input port 4 and the drain is coupled to the output port 5. The potential divider 6 is coupled across the output (between the output port 5 and ground) and the feedback node 7 provides a DC feedback signal to the other input of the error amplifier 2. A bypass capacitor 8 is coupled between the output port 5 and ground and the closed loop load is indicated by reference 9. Operation of this circuit will be well known to those skilled in the art.

FIGS. 2 to 5 illustrate examples of well known frequency compensation schemes. In each case details of such things as the DC feedback circuit and reference supply have been omitted for simplicity.

Figure 2:
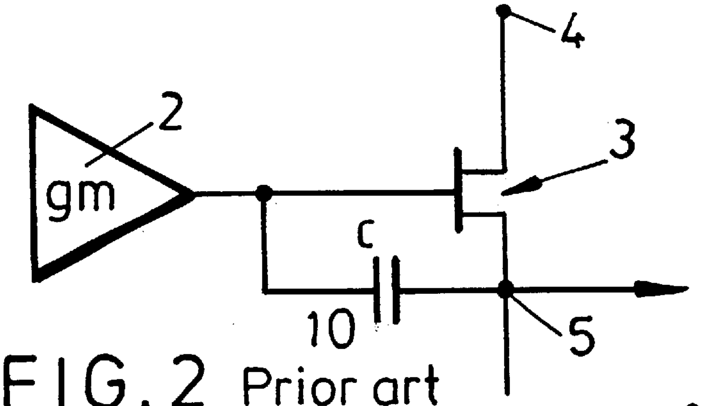
FIG. 2 Prior art
FIGS. 2 to 5 illustrate examples of conventional LDO regulator frequency compensation schemes.

FIG. 2 illustrates a basic Miller compensation scheme in which a capacitor 10 is coupled between the output port 5 and the output of the amplifier 2. The Miller compensation scheme is used to ensure that the LDO regulator is well behaved over a wide range of frequencies. In particular, the capacitor 10 inserts a dominant pole which rolls off the gain of the regulator at high frequencies to avoid stability problems. The basic Miller compensation scheme shown in FIG. 2 suffers from the disadvantage that fluctuations of power voltage provided to the differential amplifier 2 will be transmitted via the capacitor 10 to the output node 5.

Figure 3:
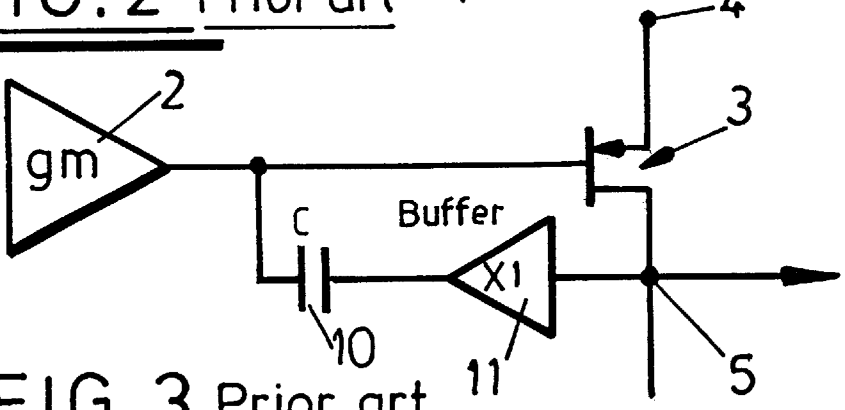
FIG. 3 Prior art
Figure 4:
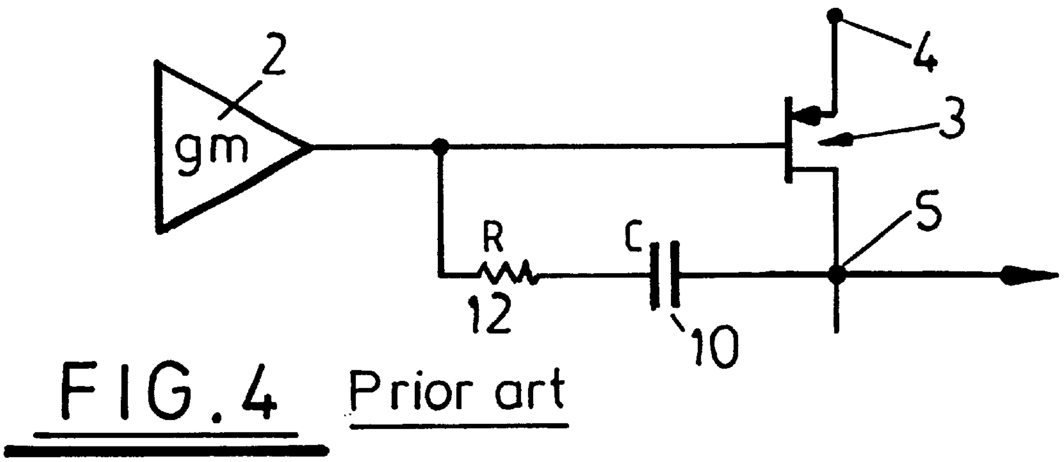
FIG. 4 Prior art
Figure 5:
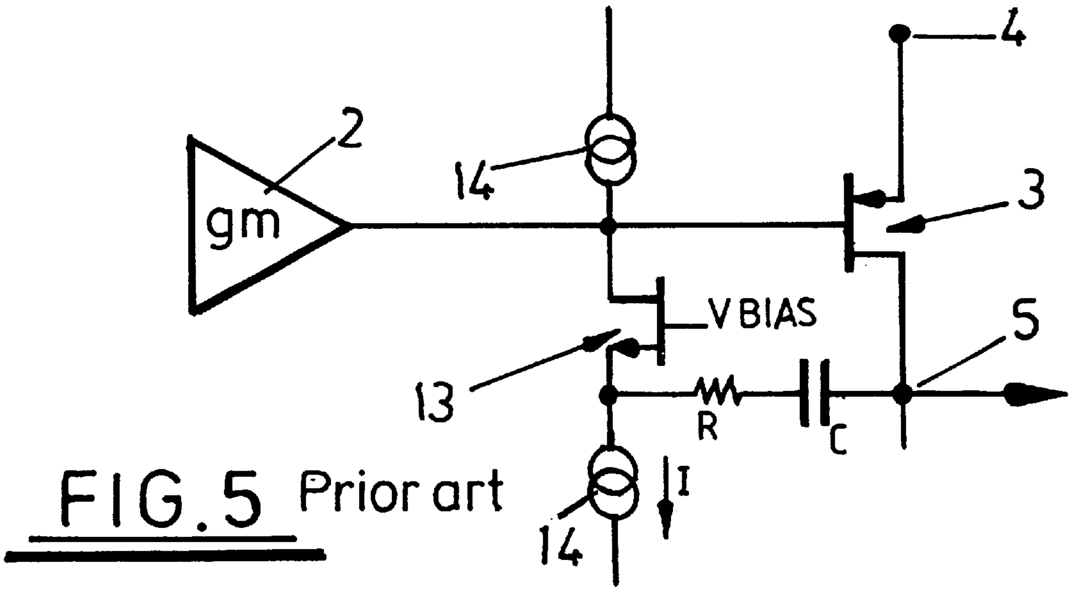
FIG. 5 Prior art

FIGS. 3 to 5 illustrate variations of the basic Miller compensation scheme. FIG. 3 illustrates a buffered Miller compensation scheme in which a voltage buffer 11 is coupled in series with the capacitor 10 between the output port 5 and the amplifier output. The voltage buffer 11 provides enhanced stability by eliminating the feedforward path from the amplifier output to the output port 5.

FIG. 4 is a pole zero Miller compensation scheme, in which a resistor 12 is coupled in series with the capacitor 10 between the output port 5 and the output of the amplifier 2. The pole zero compensation scheme nulls the effect of the feedforward path, thereby increasing the stability of the LDO regulator.

FIG. 5 illustrates a cascoded compensation scheme in which a biased transistor 13 and bias currents 14 are added to the RC compensation circuit. The biased transistor and bias currents 14 act as a current buffer which provides supply rejection. This scheme suffers from the disadvantage that it may introduce undesirable offsets into the LDO regulator.

Operation of the circuits illustrated in FIGS. 2 to 5 will be well known to those skilled in the art.

The Miller compensation schemes illustrated in FIGS. 2 to 5 rely on the gain of the pass transistor 3. However, at high frequencies, a large value of load capacitance will reduce the gain of the pass transistor 3, thereby degrading the effectiveness of the Miller compensation. Furthermore, the capacitance of the load may also cause abrupt changes of the phase of the output from the pass transistor 3. These two effects together degrade the phase margin and the range of stability provided by the LDO regulator.

Figure 6:
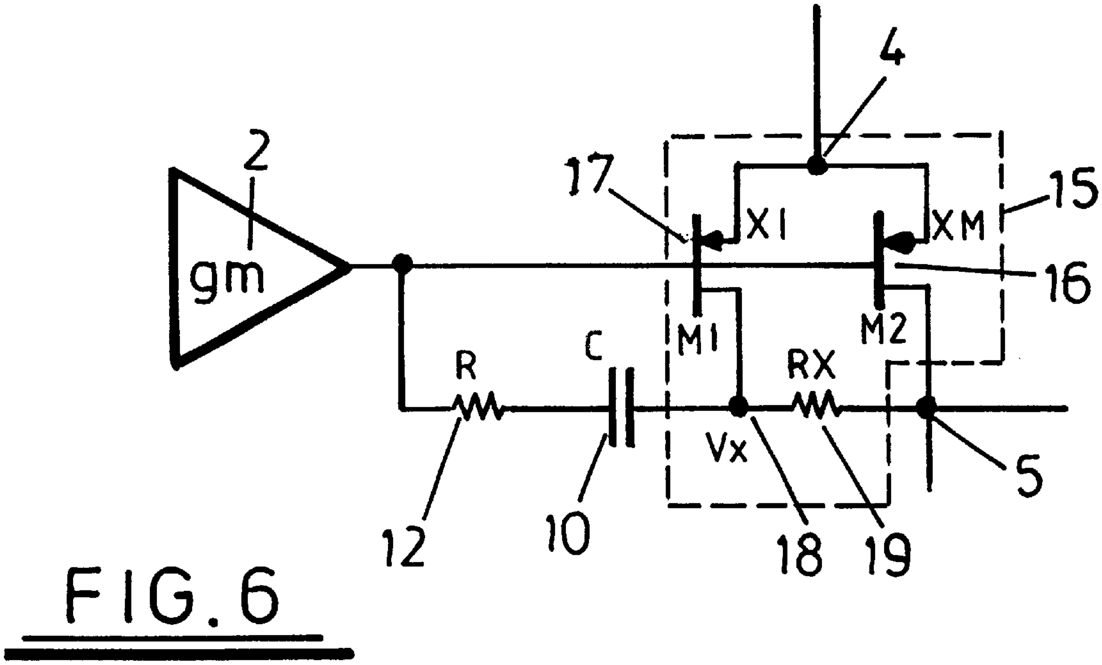
FIG. 6 illustrates a first embodiment of the present invention.

FIG. 6 illustrates the basic scheme of an amplifier compensating circuit in accordance with the present invention. Once again details of the feedback control circuit, and reference voltage supply circuit etc (which may be entirely conventional) have been omitted for simplicity. Like reference numerals are used where components correspond to those of the prior art arrangements described above. It will be seen that the illustrated circuit may be regarded as conventional in so far as it comprises an error amplifier 2 controlling the gate voltage of a P-MOSFET based output stage indicated by the broken line 15 coupled between input port 4 and output port 5 with an RC Miller compensation circuit comprising a capacitor 10 and resistor 12. Where the circuit according to the present invention differs from the prior art is that in place of a single transistor output stage, the illustrated circuit comprises a ratioed pair of matched transistors 16, 17. The transistors 16, 17 have a common source coupled to the input port 4 and a common gate coupled to the output of the amplifier stage 2. The drain of the transistor 16 is coupled to the output port 5 and the drain of the transistor 17 is coupled to the RC compensating circuit comprising capacitor 10 and resistor 12 via compensating circuit node 18. The drains of the transistors 16 and 17 are separated by a resistor 19 which is connected between the compensating circuit node 18 and the output port 5.

The transistors 16 and 17 may be referred to as primary and secondary transistors. The primary transistor 16 is a P-MOSFET having a surface area which is of the order of 5,000 times greater than the surface area of the secondary transistor (which is also a P-MOSFET). This means that, for a given gate voltage, the majority of the current supplied from the input port 4 will pass through the primary transistor 16 and to the output node 5. The resistor 19, which may be typically of the order of 10 kΩ, effectively isolates the drain of the secondary transistor such that it remains largely unaffected by the capacitance of a load at the output port 5. Thus, the gain of the secondary transistor 17 is relatively constant, and the Miller compensation provided by the capacitor 10 and the resistor 12 is to a large extent independent of the load at the output port 5.

The circuit illustrated in FIG. 6 may be considered to isolate an AC compensation component (which is passed via the resistor 12 and capacitor 10) from the DC output (which is passed to the output port 5). The resistor 19 ensures that a compensation voltage is always maintained at the drain of the secondary transistor 17 irrespective of the load conditions seen by the primary transistor 16. This provides an enhanced range of stability in comparison to the circuits illustrated in FIGS. 2 to 5.

Figure 7:
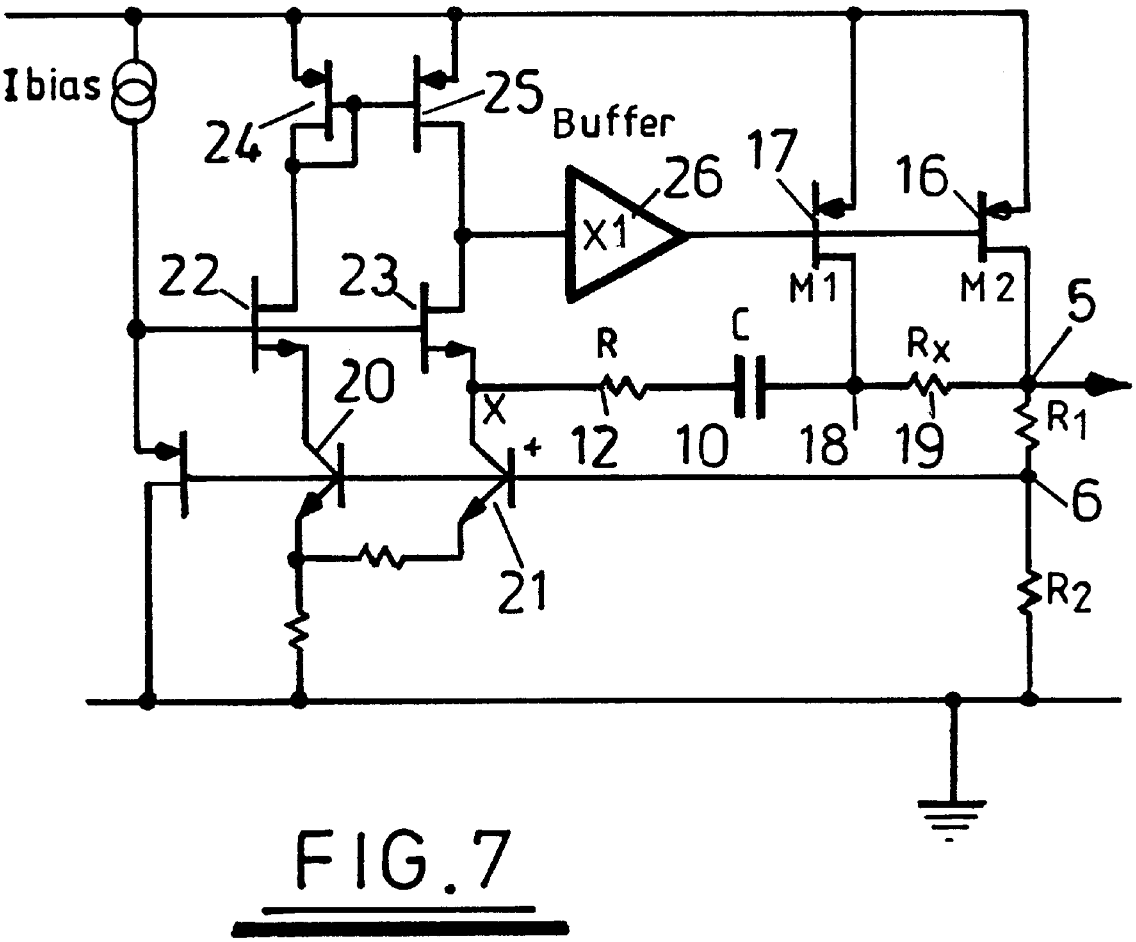
FIG. 7 illustrates a second embodiment of the present invention.

FIG. 7 shows a simple practical implementation of the amplifier compensating circuit of FIG. 6, with corresponding components provided with like reference numerals. The circuit illustrated in FIG. 7 includes a refinement which provides improved supply rejection (supply rejection is discussed in relation to FIGS. 2 to 4 of the prior art).

The error amplifier shown in FIG. 6 is replaced in FIG. 7 with an amplifier comprising two transistors 20, 21. The circuit is further provided with two cascode transistors 22, 23, and a current mirror comprising two further transistors 24, 25. In operation, DC feedback is provided via the amplifier comprising transistors 20 and 21, with input to the amplifier 20, 21 being taken from a voltage divider 6 connected between the output port 5 and ground.

Miller compensation is provided via the capacitor 10 and resistor 12. The source follower transistor 27, transistor 24 and 25 and the cascode transistor 23 combine to fixed the DC voltage at the source of the cascode transistor 23, thereby providing a low impedance node.

A buffer 26 is used to provide a low impedance output for driving the secondary transistor 17.

In the above described embodiments of the invention the output devices are P-MOSFETs, which is the preferred arrangement. For instance, the output devices represented by transistors 16 and 17 above could in fact each comprise a plurality of individual identical P-MOSFETs integrated on a single chip the primary and secondary output stages comprising different numbers of individual MOSFETS coupled in parallel to provide the required current ratio. For instance, in a typical chip the primary output device may comprise of the order of 17,000 individual P-MOSFETs and the secondary output device may comprise a very small number, of the order of 4 or 5, individual P-MOSFETs. Thus, the invention can be implemented using conventional techniques and integrated on a common chip together with other amplifier components.

It will be appreciated that the invention can be implemented with other types of devices and is not limited to P-MOSFETs. For instance, pnp bipolar transistors can be used. Similarly, N-MOSFETs or npn transistors can be used if a negative polarity output supply is required.

The invention is not limited to application with a simple RC compensating circuit and various enhancements could be added to the compensating circuit in accordance with conventional techniques.

It will be appreciated that although the above described embodiments of the invention are LDO regulators, the invention is not limited in application to such regulators. Rather, the invention has utility in any multi-stage amplifier circuit requiring frequency compensation. In addition, the compensating scheme need not necessarily form part of an output stage of the amplifier circuit, but could equally be provided as an intermediate gain stage of an amplifier circuit in which case the input and outputs 4 and 5 will be input nodes and output nodes to the gain stage rather than input and output ports of the amplifier circuit as a whole.

Other possible modifications and applications of the frequency compensation scheme according to the present invention will be readily apparent to the appropriately skilled person.

I claim:

1. An amplifier circuit comprising a first amplifier stage controlling a second gain stage which is coupled between an input node and an output node, and a frequency compensating circuit coupled between a compensating circuit node of the second gain stage and a control input of the second gain stage, wherein the gain stage comprises:

first and second output devices arranged such that for a given gate voltage, the output current from the first device is greater than the output current from the second device;

the output devices having a common source coupled to the input node and a common gate coupled to the first amplifier stage;

the drain of the first output device being coupled to the output node and the drain of the second output device being coupled to the compensating circuit node; and a resistance device connected between the drains of the two output devices.

2. An amplifier circuit according to claim 1, wherein for a given gate voltage, the output current from the first output device is more than 1000 times greater than the output current from the second output device.

3. An amplifier circuit according to claim 1, wherein said resistance device is a device having a resistance of about 1 kΩ to 20 kΩ.

4. An amplifier circuit according to claim 1, wherein the two output devices are matched such that the gate of the first output device responds to a control signal from the amplifier in the same way as the gate of the second output device.

5. An amplifier circuit according to claim 1, wherein the output devices are FET devices, the total channel area of the first device being greater than the total channel area of the second device.

6. An amplifier circuit according to claim 5, wherein the second output device comprises one or more FETs connected in parallel and said first output device comprises a plurality of parallel FETs greater in number than the number of FETs comprising the second output device.

7. An amplifier circuit according to claim 6, wherein said individual FETs are substantially identical and are integrated on a single chip.

8. An amplifier circuit according to claim 5, wherein the first and second output devices are P-MOSFET devices.

9. An amplifier circuit according to claim 1, wherein said output devices comprise bipolar transistors, the total surface area of the emitter of the first output device being greater than the total surface area of the emitter of the second output device.

10. An amplifier circuit according to claim 9, wherein the first and second output devices each comprise substantially identical individual transistors, the second output device comprising one or more of said transistors and the first output device comprising a plurality of said transistors greater in number than the number of transistors comprising said second device to provide said current ratio.

11. An amplifier circuit according to claim 10, wherein said transistors are pnp or npn transistors integrated on a single chip.

12. An amplifier circuit according to claim 1, wherein the compensating circuit comprises a capacitor.

13. An amplifier circuit according to claim 12, wherein the compensating circuit comprises a resistor in series with said capacitor.

14. An amplifier circuit according to claim 1, wherein the second gain stage is an output stage and the input and output nodes are input and output ports respectively of the amplifier circuit.

15. A voltage regulator circuit comprising an amplifier circuit according to claim 1, further comprising a reference voltage generator providing a reference voltage signal to an input of said first amplifier stage, means for generating a feedback voltage dependent upon the voltage at the output node and providing a feedback signal to the second input of the first amplifier stage, wherein the second gain stage is responsive to the output of the amplifier such that the voltage at the output node is determined by the reference voltage.

16. A voltage regulator according to claim 15, wherein the regulator is a low dropout voltage regulator.

17. A frequency compensating circuit for an amplifier circuit which comprises an output device coupled between an input node and an output node and controlled by an amplifier stage, the source of the output device being coupled to the inlet node, the drain of the output device being coupled to the outlet node, and the gate of the outlet device being coupled to the amplifier, the frequency compensating circuit comprising:

a second output device having its source coupled to the input node and its gate coupled to the output of the amplifier stage in common with the first output device; and a capacitor coupled between the drain of the second output device and the common gate of the first and second output devices;

wherein the second output device is configured to produce a smaller current than the first output device for a given gate voltage, and the drains of the first and second output devices are separated by a resistance device.

18. A frequency compensating circuit according to claim 17, wherein the second output device is configured such that the ratio of currents produced by the first and second output devices is greater than 1000:1.

19. A frequency compensating circuit according to claim 17, wherein said resistance device is a device having a resistance of 1 kΩ to 20 kΩ.

20. A frequency compensating circuit according to claim 17, wherein the second output device is matched to the first output device such that the two devices respond to a control signal from the amplifier stage in the same way.

21. A frequency compensating circuit according to claim 17, further comprising a resistor coupled in series with said capacitor.

22. A frequency compensating circuit according to claim 17, wherein said second output device is a P-MOSFET device.

* * * * *